US006894920B2

(12) United States Patent
Kim et al.

(10) Patent No.: US 6,894,920 B2
(45) Date of Patent: May 17, 2005

(54) MAGNETIC RANDOM ACCESS MEMORY (MRAM) FOR SPONTANEOUS HALL EFFECT AND METHOD OF WRITING AND READING DATA USING THE MRAM

(75) Inventors: Tae-wan Kim, Anyang (KR); Kee-won Kim, Yongin (KR); Wan-jun Park, Seoul (KR); I-hun Song, Seongnam (KR); Sang-jin Park, Pyeongtaek (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/465,602

(22) Filed: Jun. 20, 2003

(65) Prior Publication Data

US 2003/0235072 A1 Dec. 25, 2003

(30) Foreign Application Priority Data

Jun. 22, 2002 (KR) .................................. 10-2002-35141

(51) Int. Cl.$^7$ .............................................. G11C 11/00
(52) U.S. Cl. ..................... 365/158; 365/170; 365/171
(58) Field of Search .................................. 365/158, 170, 365/171, 173

(56) References Cited

U.S. PATENT DOCUMENTS 5,331,589 A * 7/1994 Gambino et al. ........... 369/126
5,396,455 A    3/1995 Brady et al.
6,603,678 B2 * 8/2003 Nickel et al. ............... 365/171

* cited by examiner

Primary Examiner—Gene N. Auduong
(74) Attorney, Agent, or Firm—Lee, Sterba & Morse, P.C.

(57) ABSTRACT

A magnetic RAM (MRAM) using a thermo-magnetic spontaneous Hall effect includes a MOS transistor formed on a substrate; a heating layer formed above the MOS transistor and connected to a source region of the MOS transistor; a memory layer having a data write area to which data is written, the data write area being formed on the heating means; a bit line formed on the data write area; an upper insulating film formed on the bit line and the memory layer; and a write line formed on the upper insulating film so that a magnetic field necessary for writing data is generated in at least the data write area of the memory layer. The MRAM writes or reads data using the fact that a spontaneous Hall voltage greatly differs according to the magnetization state of a memory layer, thereby providing the device a high data sensing margin.

26 Claims, 5 Drawing Sheets

MAGNETIC RANDOM ACCESS MEMORY (MRAM) FOR SPONTANEOUS HALL EFFECT AND METHOD OF WRITING AND READING DATA USING THE MRAM

BACKGROUND OF THE INVENTION

1. Field of the Invention

The present invention relates to the field of magnetic random access memory (MRAM) and methods of writing and reading data using the MRAM. More particularly, the present invention relates to an MRAM using a thermo-magnetic spontaneous Hall effect and a method of writing and reading data using the MRAM.

2. Description of the Related Art

Giant MagnetoResistance (GMR) is derived by a variation in the resistance of a thin film depending on whether two adjacent magnetic layers are magnetized in parallel or counter-parallel directions when electrons pass through the two magnetic layers. GMR may be described with reference to spin-dependent scattering. Even when an insulating film, such as an aluminum oxide film ($Al_2O_3$), as opposed to a metallic film, is interposed between the two magnetic layers, spin-dependent scattering occurs. Spin-dependent scattering is referred to as Tunneling MagnetoResistance (TMR).

Conventional MRAMs are non-volatile memory devices using GMR or TMR. Accordingly, information recorded in these MRAMs is not lost even when power is off, which is in contrast with dynamic random access memory (DRAM) and static random access memory (SRAM).

A GMR memory has a spin-valve structure that is composed of a pinned layer having a high coercive force and a free layer having a low coercive force. In the GMR memory, information writing is achieved by changing the spinning direction of the free layer using a produced magnetic field generated by a current applied to word lines and bit lines. Information reading is achieved by applying a current to the word lines and measuring a resistance from the bit lines.

A TMR memory has large magnetic resistance as compared to a GMR memory. Accordingly, if the TMR memory is used, a high signal may be obtained and power consumption may be reduced. However, when the TMR memory is downsized, an operating time thereof is lengthened and noise is increased, since the TMR memory has a significant amount of resistance, for example, about 106 $\Omega$-$\mu m^2$.

In such conventional MRAMs, when a cell size is reduced to a size of sub-microns or less, coercivity increases, and the thermal security of a cell degrades. These characteristics prevent a high level of integration.

SUMMARY OF THE INVENTION

In an effort to solve the above-described problems, it is a feature of an embodiment of the present invention to provide a magnetic random access memory (MRAM) using a thermo-magnetic spontaneous Hall effect that is capable of being highly integrated, operating at an ultrahigh speed, and being simply manufactured to lower the manufacturing costs.

Another feature of an embodiment of the present invention is to provide a data writing method using the MRAM.

Still another feature of an embodiment of the present invention is to provide a data reading method using the MRAM.

To provide the first feature, an embodiment of the present invention provides a magnetic RAM using a spontaneous Hall effect including a metal-oxide-semiconductor (MOS) transistor having a source region, a drain region, and a gate formed on a substrate; a heating means formed above the MOS transistor and connected to the source region of the MOS transistor; a memory layer having a data write area to which data is written, the data write area being formed on the heating means; a bit line formed on the data write area; an upper insulating film formed on the bit line and the memory layer; and a write line formed on the upper insulating film so that a magnetic field necessary for writing data is generated in at least the data write area of the memory layer.

Preferably, the MRAM also includes a metal wiring for electrically connecting the source region of the MOS transistor to the heating means, wherein the metal wiring is either an aluminum wiring or a doped polysilicon wiring.

Preferably, the MRAM also includes a word line formed above the MOS transistor and connected to the gate of the MOS transistor. The MRAM may further include a lower insulating film interposed between the metal wiring and connected to the heating means and the word line.

Preferably, the bit line is perpendicular to the memory layer, the memory layer is parallel to the word line, and the write line is parallel to the memory layer.

Preferably, the MRAM further includes a ground line connected to the drain region of the MOS transistor. Preferably, the heating means is provided above the gate of the MOS transistor, wherein the heating means is either a nickel and chrome alloy layer or a titanium aluminum nitride (TiAlN) layer, and the heating means is capable of being heated by current.

Preferably, the memory layer is an amorphous rare earth (RE)-transition metal (TM) layer, specifically, a TbCo alloy layer. The upper insulating film may be a silicon oxide film.

To provide the second feature of an embodiment of the present invention, there is provided a first data writing method including selecting a unit memory cell having a memory layer to which data is written; and writing data by heating the memory layer until the memory layer enters into a paramagnetic state.

To provide the second feature of an embodiment of the present invention, there is provided a second data writing method including selecting a unit memory cell having a memory layer to which data is written; writing a first data to the memory layer by heating the memory layer until the memory layer enters into a paramagnetic state; and writing a second data to the memory layer by changing the magnetization state of the memory layer from a paramagnetic state to a ferromagnetic state using application of an external magnetic field.

In either of the first or second data writing methods, the memory layer is preferably heated by a heating means provided below the memory layer, and the memory layer may be heated by a current flowing through the heating means. Similarly, the memory layer may be an amorphous rare earth (RE)-transition metal (TM) layer and the heating means may be either a nickel and chrome alloy layer or a titanium aluminum nitride (TiAlN) layer.

In the second data writing method, the paramagnetic state of the memory layer is preferably changed to the ferromagnetic state by making current flow on and parallel to the memory layer. In addition, the external magnetic field is preferably generated by a write current flowing through a write line provided above the memory layer.

To provide the third feature of an embodiment of the present invention, there is provided a data reading method including selecting a unit memory cell having a memory layer to which data has been written; applying a read current to the memory layer in the selected unit memory cell; and measuring a spontaneous Hall voltage of the memory layer to read data from the memory layer.

Preferably, measuring the spontaneous Hall voltage of the memory layer to read data from the memory layer includes determining whether the memory layer is in a paramagnetic or ferromagnetic state based on the measured spontaneous Hall voltage.

An MRAM according to an embodiment of the present invention, increases the coercivity caused by high integration and improves the thermal security of a cell. The MRAM is able to operate at an ultrahigh speed because of a small cell resistance. In addition, since the MRAM may be simply manufactured using existing semiconductor manufacturing processes, the manufacturing costs are reduced. Furthermore, since the MRAM writes or reads data using the fact that a spontaneous Hall voltage greatly differs according to the magnetization state of a memory layer, an MRAM of the present invention provides a high data sensing margin.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
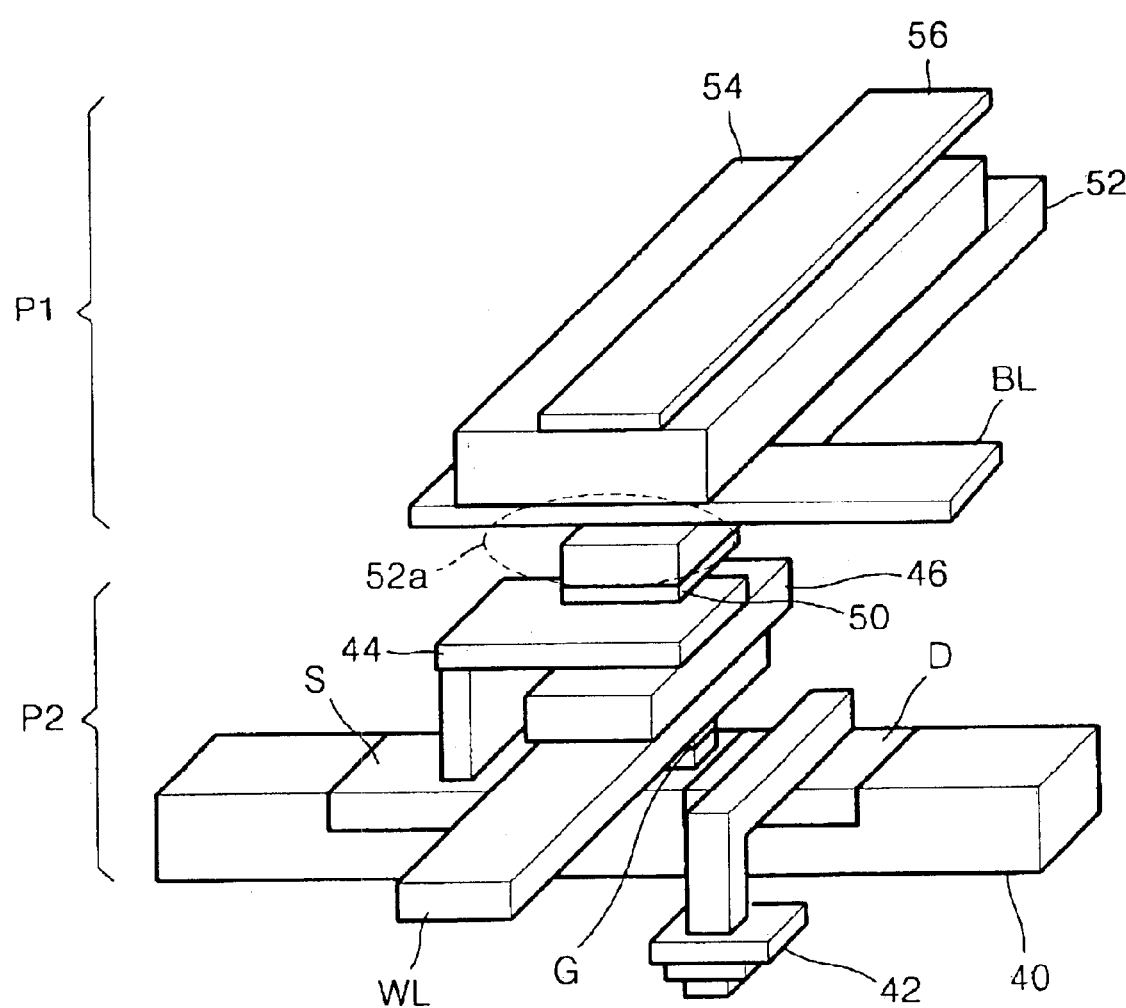
FIG. 1 illustrates a perspective view a unit memory cell for a magnetic random access memory (MRAM) using a thermo-magnetic spontaneous Hall effect, according to an embodiment of the present invention.

Korean Patent Application No. 2002-35141, filed on Jun. 22, 2002, and entitled: "Magnetic Random Access Memory (RAM) Using Thermo-Magnetic Spontaneous Hall Effect and Method of Writing and Reading Data Using the Magnetic RAM," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

A magnetic random access memory (MRAM) according to an embodiment of the present invention is a memory layer to which data is written, the memory layer preferably being formed of an amorphous rare earth transition metal (hereinafter referred to as "amorphous RE-TM"), which is magnetic. The memory layer uses a spontaneous Hall effect, which varies according to the magnetized state of the memory layer. In other words, the Hall voltage of the memory layer differs according to the magnetized state of the memory layer. An MRAM according to an embodiment of the present invention uses the spontaneous Hall effect in order to write and read data.

The spontaneous Hall effect is caused by a spin-orbit interaction, that is, the interaction of free electrons and magnetic moments within a magnetic material, which is a unique characteristic of the magnetic material. The spontaneous Hall effect within a magnetic material is significantly greater than a Hall effect due to a Lorentz force (hereinafter, referred to as the "normal Hall effect"). In particular, since the spontaneous Hall effect in an amorphous RE-TM is significantly greater than the normal Hall effect, the Hall voltage due to the normal Hall effect in the present invention is negligible.

The spontaneous Hall effect in the memory layer varies according to the magnetized state of the memory layer itself. In other words, the spontaneous Hall effect in the memory layer greatly differs depending on whether the memory layer is in a paramagnetic state or in a ferromagnetic state.

If the memory layer is formed of an amorphous RE-TM, when it is heated to a Curie point thereof or higher, the memory layer enters into a paramagnetic state, in which electrons spin in arbitrary directions. Accordingly, in the paramagnetic state, a spontaneous Hall voltage caused by the spontaneous Hall effect of the memory layer is reduced. When the memory layer is in the paramagnetic state, if an external magnetic field is applied, the electrons in the memory layer are lined up in a particular direction along the external magnetic field. In other words, the electrons in the memory layer spin in a direction parallel to the direction of the external magnetic field, such that the memory layer enters into a ferromagnetic state. As a result, a spontaneous Hall voltage due to the spontaneous Hall effect of the memory layer is much higher in the ferromagnetic state than when the memory layer is in the paramagnetic state.

The present invention relates to an MRAM for writing or reading data, i.e., "0" or "1," using the above-described characteristics of the memory layer and a data writing and reading method using the characteristics.

An MRAM according to an embodiment of the present invention includes a plurality of unit memory cells to which data is written on a bit-by-bit basis. FIG. 1 illustrates a perspective view of the structure of a unit memory cell.

Referring to FIG. 1, the unit memory cell is composed of upper and lower structures P1 and P2, respectively. A heating means 50 is interposed between the upper and lower structures P1 and P2.

The lower structure P2 includes a MOS transistor (e.g., an NMOS transistor) and a metal wiring 44 for electrically connecting the impurity region of the MOS transistor, for example, a source region S, to the heating means 50. The metal wiring 44 may be one of various conductive wirings, for example, an aluminium wiring or a doped polysilicon wiring. In the lower structure P2, reference characters G and D denote a gate and a drain, respectively, of the MOS transistor. Reference character WL denotes a word line connected to the gate G. Reference numerals 40 and 42 denote a substrate on which the MOS transistor is formed and a ground line connected to the drain D, respectively. In this embodiment of the present invention, a lower insulating film 46 is interposed between the metal wiring 44 connected to the heating means 50 and the word line WL.

The upper structure P1 includes a memory layer 52, a bit line BL, an upper insulating film 54, and a write line 56. The memory layer 52 has an area 52a to which data, "0" or "1," is written and is parallel to the word line WL. The bit line BL is perpendicular to the memory layer 52 and switches data written to the memory layer 52. The upper insulating film 54 is formed on the memory layer 52 and the bit line BL. The write line 56 is installed on the upper insulating film 54 and parallel to the memory layer 52. In order to write data to the area 52a (hereinafter referred to as the "data write area") of the memory layer 52, first, the data write area 52a is heated by the heating means 50 to a predetermined temperature (preferably, a Curie point) or higher. Next, the magnetization state of the data write area 52a is determined according to the type of data to be written in order to determine the level of the spontaneous Hall voltage of the data write area 52a.

If the data to be written is "1," the data write area 52a enters into a ferromagnetic state in order to obtain high spontaneous Hall voltage. However, if the data to be written is "0," the data write area 52a enters into a paramagnetic state in order to obtain low spontaneous Hall voltage. Alternatively, if the data to be written is "1," the data write area 52a enters into the paramagnetic state in order to obtain low spontaneous Hall voltage. However, if the data to be written is "0," the data write area 52a enters into the ferromagnetic state in order to obtain high spontaneous Hall voltage.

When data is written to the data write area 52a of the memory layer 52, the magnetization state of the memory layer 52 is determined by the write line 56. That is, the spontaneous Hall voltage of the data write area 52a is also determined by the write line 56.

Specifically, when data "1" is written to the data write area 52a, a current value is applied to the write line 56. As a result, a magnetic field having an intensity proportional to the current value is formed around the write line 56, and the data write area 52a is placed within the magnetic field. At this time, the data write area 52a that is heated to a predetermined temperature or higher is in the paramagnetic state. When the magnetic field passes through the data write area 52a in the paramagnetic state, the spinning directions of the electrons of the data write area 52a are lined up parallel to the magnetic field. Consequently, the magnetization state of the data write area 52a is changed from the paramagnetic state to the ferromagnetic state, and then a high spontaneous Hall voltage is obtained. Accordingly, the data "1" is considered to be written to the data write area 52a.

On the other hand, if data "0" is written to the data write area 52a, a current is not applied to the write line 56. Accordingly, no magnetic field is formed around the write line 56. In contrast with the case where data "1" is written, there is no magnetic field to pass through the data write area when data "0" is written. Hence, the paramagnetic state of the data write area 52a that is obtained from the heating is maintained, and the spontaneous Hall voltage of the data write area 52a is reduced. From the low spontaneous Hall voltage of the data write area 52, the data "0" is considered to be written to the data write area 52.

The memory layer 52 is preferably an amorphous RE-TM layer. More preferably, the memory layer 52 is a TbCo alloy layer having terbium (Tb) and cobalt (Co). The data write area 52a of the memory layer 52 is placed on the heating means 50 so that they are in contact. The upper insulating film 54 is preferably a silicon oxide film but may alternatively be formed of another film. The heating means 50 is a material layer, which is heated by a current received from the MOS transistor of the lower structure P2 and flowing through the bit line BL in order to heat the data write area 52a of the memory layer 52. The heating means 50 may be formed of a nickel chrome (NiCr) alloy layer or a titanium aluminium nitride (TiAlN) layer. Preferably, the heating means 50 heats the data write area 52a to a predetermined temperature or higher (for example, 250° C. if the memory layer 52 is an alloy layer of terbium and cobalt) for a given period of time. More preferably, the heating is performed to the Curie point or higher for a short time.

Hereinafter, a method of writing data to the MRAM will be described with reference to FIGS. 2 and 3. A method of writing a first data "1" or "0" will be described with reference to FIG. 2, which shows the flow of current Ih applied to heat the heating means 50 of the MRAM of FIG. 1 and a magnetic field B formed in the data write area 52a by a current Iw applied to the write line 56.

Figure 2:
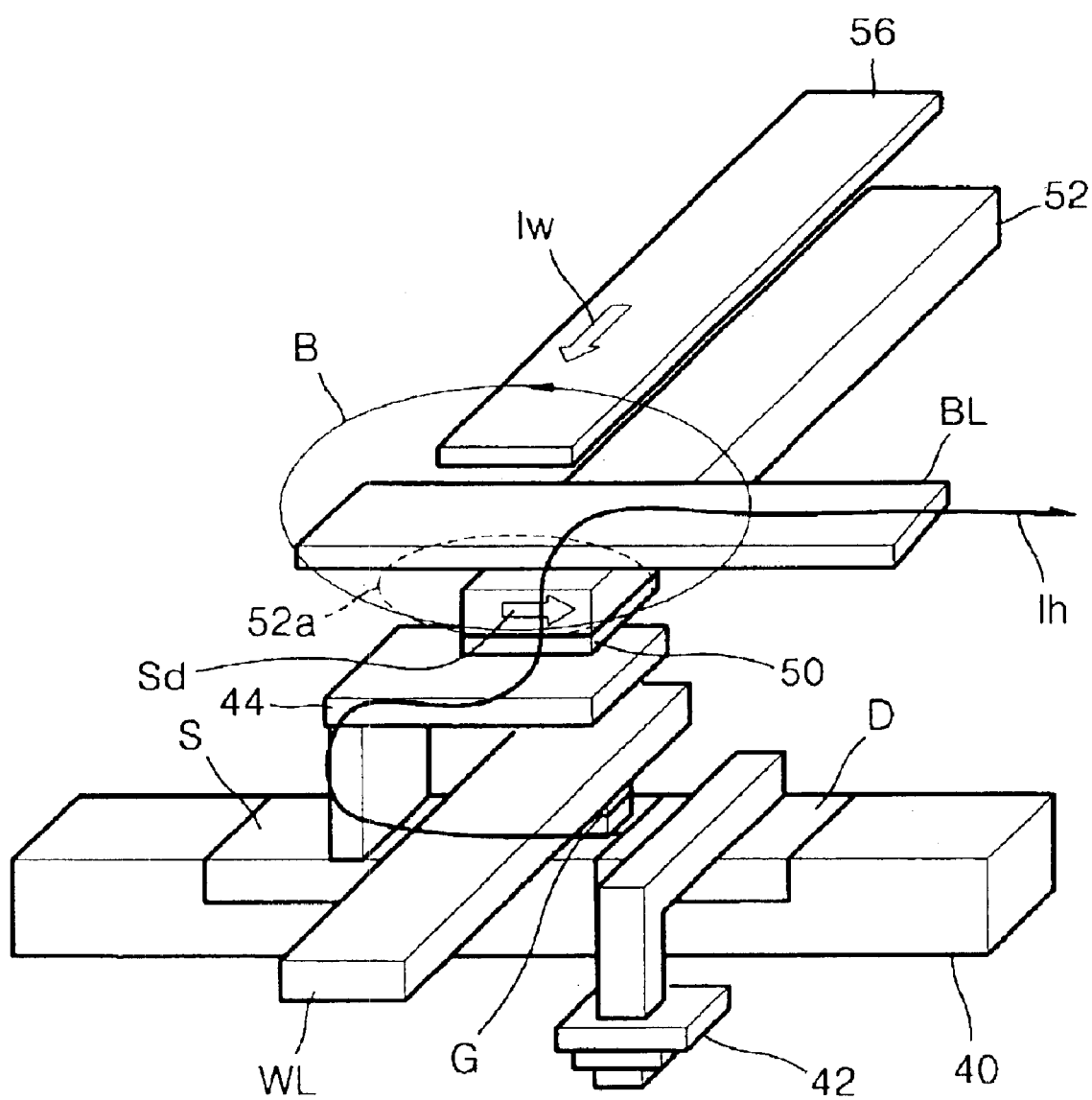
FIGS. 2 and 3 illustrate perspective views of processes for writing a first data "1" or "0," and a second data, respectively, "0" or "1," respectively, to the unit memory cell of FIG. 1.

Referring to FIG. 2, current Ih (hereinafter referred to as the "heating current") is applied from the MOS transistor of the lower structure P2 via the heating means 50 to the bit line BL. Preferably, the heating current Ih is applied to such an extent that the memory layer 52 is heated to at least the Curie point. If the memory layer 52 is a TbCo layer, it is preferable that the heating current Ih is applied to such an extent that the memory layer 52 is heated to at least 250° C. for a given period of time. When the heating means 50 is heated by the heating current Ih so as to heat the data write area 52a to the Curie point of the data write area 52a or higher, a predetermined current Iw (hereinafter referred to as the "write current") is applied to the write line 56 in order to generate a magnetic field B around the write line 56. Preferably, the write current Iw applied to the write line 56 is applied to such an extent that the magnetic field B formed in the data write area 52a has an intensity sufficient to change the magnetized state of the heated data write area 52a, which is currently in a paramagnetic state, to the ferromagnetic state. In FIG. 2, reference character Sd denotes the spinning direction of the electrons of the data write area 52a that are arranged by the magnetic field B in the direction of the magnetic field B. Since the spinning direction of the electrons of the data write area 52a is arranged in the direction of the magnetic field B, the magnetized state of the data write area 52a turns into the ferromagnetic state. The spontaneous Hall voltage of the data write area 52a is much greater in the ferromagnetic state than in the paramagnetic state. Such an increase in the spontaneous Hall voltage of the data write area 52a means that the first data "1" or "0" has been written.

Figure 3:
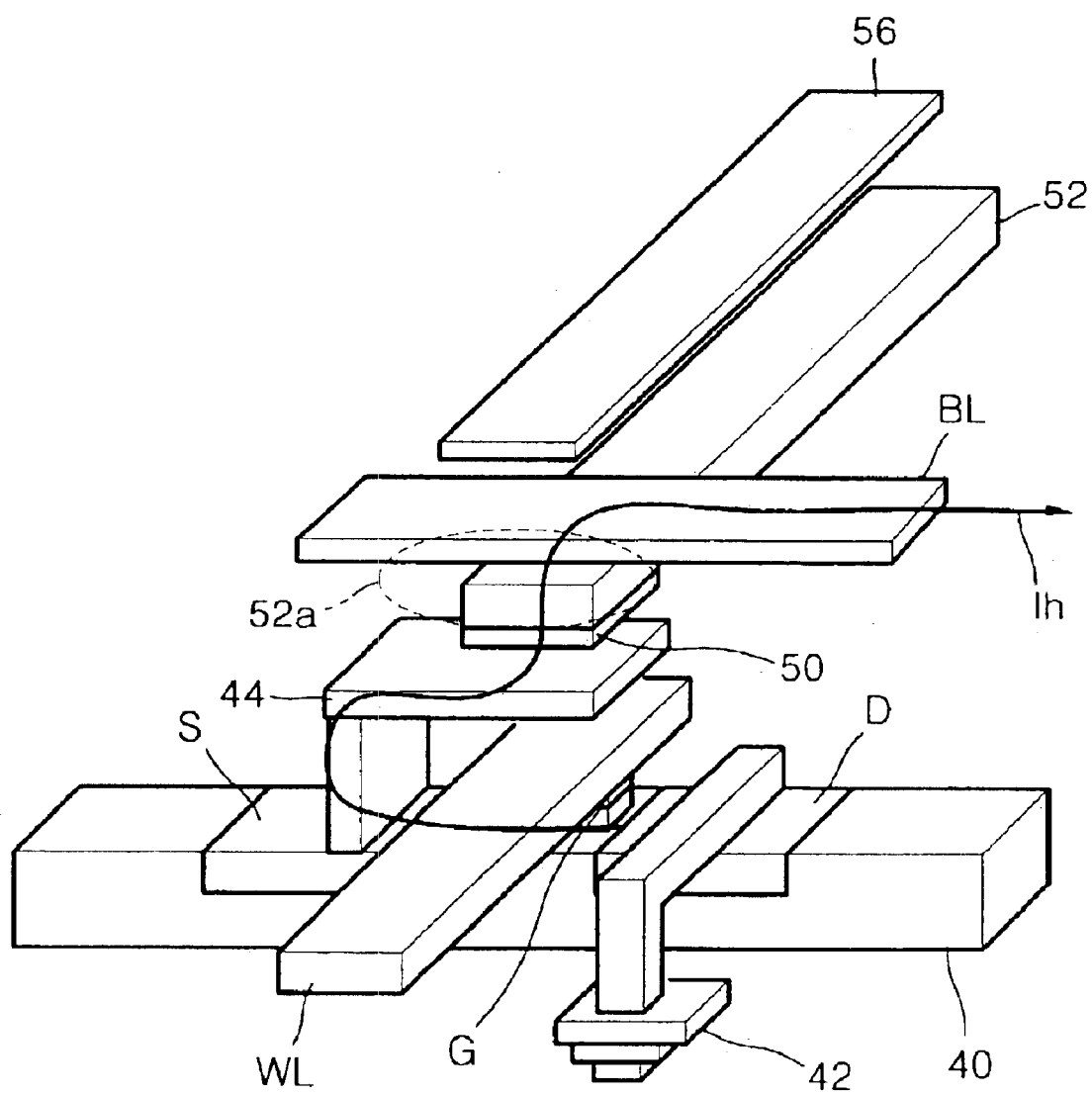

In the method of writing a second data "0" or "1," in view of the value of the first data "1" or "0," respectively, as shown in FIG. 3, the heating current Ih flows to heat the heating means 50. The heated heating means 50 heats the data write area 52a of the memory layer 52 to a predetermined temperature or higher. This process is similar to the process for writing the first data, except that a current is not applied to the write line 56 after the data write area 52a is heated. In other words, a magnetic field is not applied to the heated data write area 52a. Accordingly, the magnetized state of the data write area 52a turns into a state in which the spinning direction of electrons is arranged in arbitrary directions. That is to say, the magnetized state of the data write area 52a is in the paramagnetic state. The spontaneous Hall voltage of the data write area 52a in the paramagnetic state is far less than in the ferromagnetic state. Such a decrease in the spontaneous Hall voltage of the data write area 52a means that the second data "0" or "1," has been written.

It should be understood that in the above-described data recording method, the data "1" may be written using the method of writing data "0" and vice versa. That is, when the data write area 52a has a large spontaneous Hall voltage, it may be considered as the case that the data "0" has been written. Correspondingly, when the data write area 52a has a small spontaneous Hall voltage, it may be considered as the case that the data "1" has been written. More specifically, the method of writing the first data may write data "1" or "0" and the method of writing the second data would then write data "0" or "1," respectively.

Hereinafter, a method of reading data from the data write area 52a of the MRAM of FIG. 1 will be described. Here, when the data write area 52a has a large spontaneous Hall voltage, a data "1" will be considered to have been written. When the data write area 52a has a small spontaneous Hall voltage, a data "0" will be considered to have been written. Alternatively, as mentioned above, when the data write area 52a has a large spontaneous Hall voltage, a data "0" may be considered to have been written and when the data write area 52a has a small spontaneous Hall voltage, a data "1" may be considered to have been written.

Figure 4:
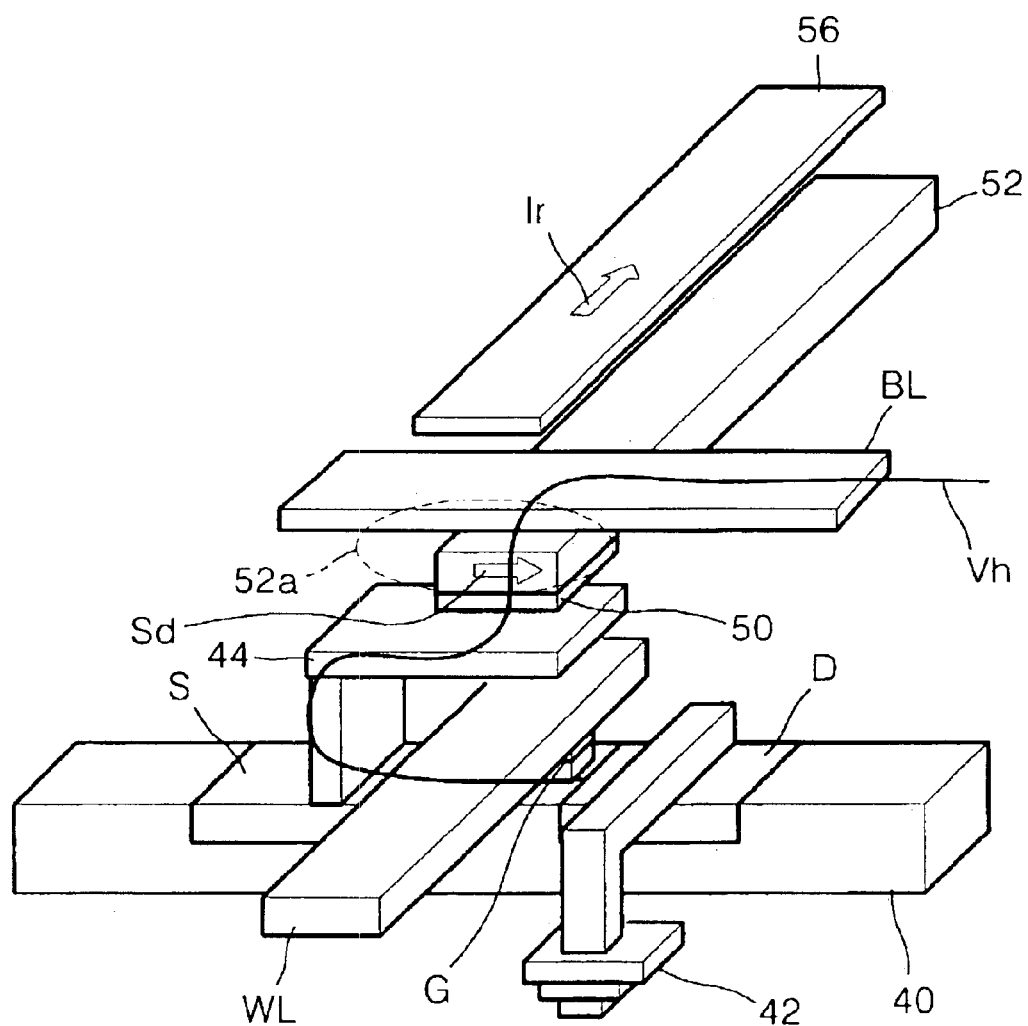
FIGS. 4 and 5 illustrate perspective views of processes for reading data "1" and "0," respectively, from the unit memory cell of FIG. 1.

In a method of reading data "1," as shown in FIG. 4, a read current Ir is applied to the write line 56, and then a spontaneous Hall voltage Vh between a top and a bottom of the data write area 52a is measured. In this case, the spontaneous Hall voltage Vh of the data write area 52a is measured to be large. Since it is known that a large spontaneous Hall voltage Vh indicates that the magnetized state of the data write area 52a is the ferromagnetic state, it may be determined that the spinning direction Sd of the electrons of the data write area 52a is the same as the direction of the magnetic field applied. From this, it may be determined that the data "1" is written.

Figure 5:
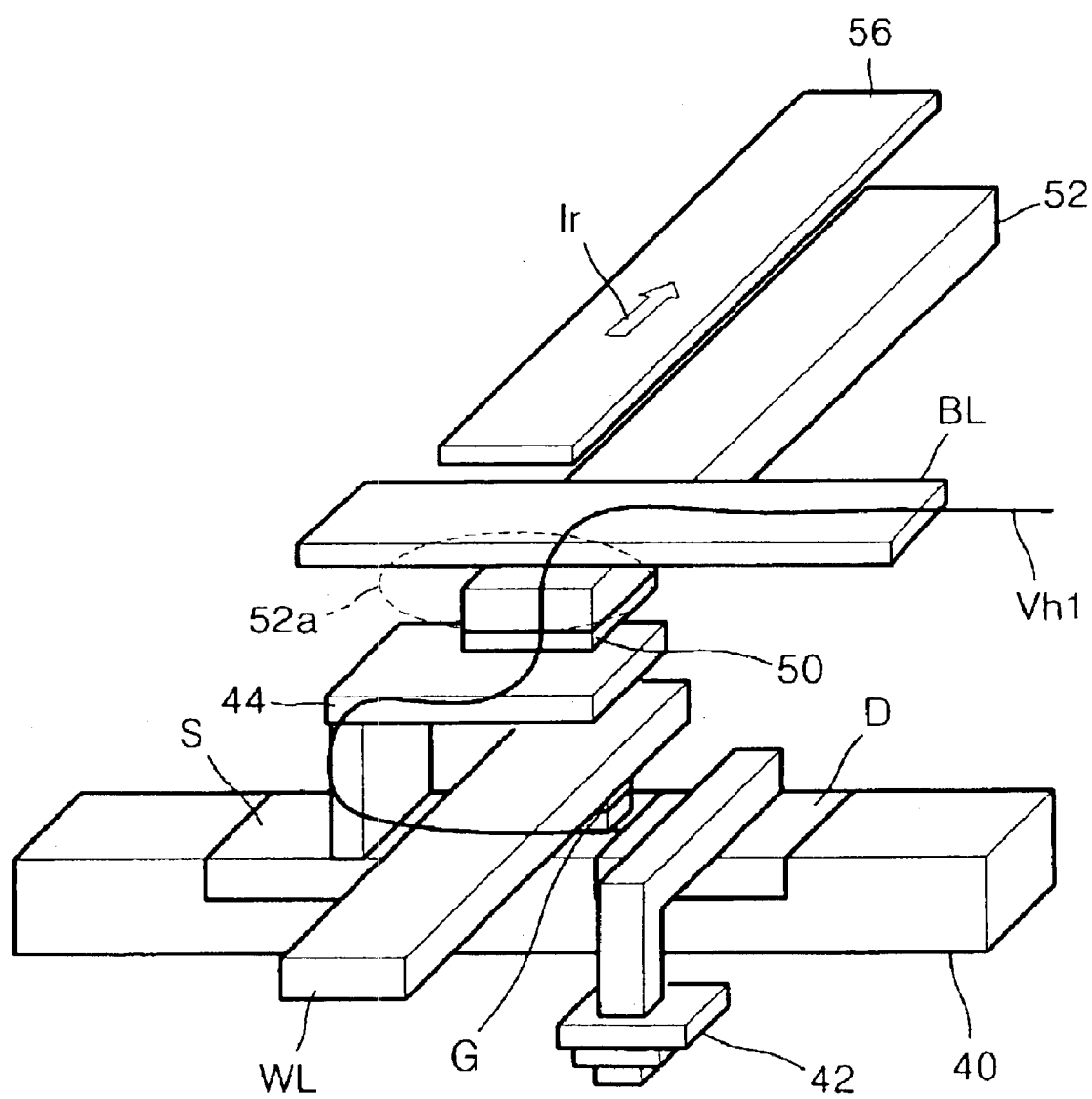

In a method of reading data "0," as shown in FIG. 5, a read current Ir is applied to the write line 56, and then a spontaneous Hall voltage Vhl between a top and a bottom of the data write area 52a is measured. In this case, the spontaneous Hall voltage Vh of the data write area 52a is measured to be relatively small. Since it is known that a small spontaneous Hall voltage Vh indicates that the magnetized state of the data write area 52a is the paramagnetic state, it may be determined that the electrons are not spinning in a particular direction and are rather spinning in arbitrary directions. From this, it may be determined that the data "0" is written.

Preferred embodiments of the present invention have been disclosed herein and, although specific terms are employed, they are used and are, to be interpreted in a generic and descriptive sense only and not for purpose of limitation. Accordingly, it will be understood by those of ordinary skill in the art that various changes in form and details may be made without departing from the spirit and scope of the present invention as set forth in the following claims. For example, the MOS transistor in the lower structure may be replaced by one of a variety of transistors, and the insulating films in the upper and lower structures may be multi-layered films.

As described above, a MRAM according to the present invention is able to increase the coercivity caused by high integration and improve the thermal security of a cell. The MRAM is also able to operate at an ultrahigh speed because of a small cell resistance. In addition, since the MRAM is able to be simply manufactured using existing semiconductor manufacturing processes, the manufacturing costs are reduced. Furthermore, since the MRAM writes or reads data depending on the spontaneous Hall voltage and the spontaneous Hall voltage greatly differs depending on the magnetization state of a memory layer, the MRAM of the present invention provides a high data sensing margin.

What is claimed is:

1. A magnetic random access memory (MRAM) using a spontaneous Hall effect, comprising:
    a metal-oxide-semiconductor (MOS) transistor having a source region, a drain region, and a gate formed on a substrate;
    a heating layer formed above the MOS transistor and connected to the source region of the MOS transistor;
    a memory layer having a data write area to which data is written, the data write area being formed on the heating layer;
    a bit line formed on the data write area;
    an upper insulating film formed on the bit line and the memory layer; and
    a write line formed on the upper insulating film so that a magnetic field necessary for writing data is generated in at least the data write area of the memory layer.

2. The MRAM as claimed in claim 1, further comprising:
    a metal wiring for electrically connecting the source region of the MOS transistor to the heating layer.

3. The MRAM as claimed in claim 2, wherein the metal wiring is either an aluminum wiring or a doped polysilicon wiring.

4. The MRAM as claimed in claim 2, further comprising:
    a word line formed above the MOS transistor and connected to the gate of the MOS transistor.

5. The MRAM as claimed in claim 4, further comprising:
    a lower insulating film interposed between the metal wiring connected to the heating layer and the word line.

6. The MRAM as claimed in claim 1, further comprising:
    a ground line connected to the drain region of the MOS transistor.

7. The MRAM as claimed in claim 1, wherein the heating layer is provided above the gate of the MOS transistor.

8. The MRAM as claimed in claim 1, wherein the heating layer is either a nickel and chrome alloy layer or a titanium aluminum nitride (TiAlN) layer.

9. The MRAM as claimed in claim 8, wherein the heating layer is capable of being heated by current.

10. The MRAM as claimed in claim 1, wherein the memory layer is an amorphous rare earth (RE)-transition metal (TM) layer.

11. The MRAM as claimed in claim 1, wherein the memory layer is a TbCo alloy layer.

12. The MRAM as claimed in claim 1, wherein the upper insulating film is a silicon oxide film.

13. A data writing method in a magnetic random access memory (MRAM) comprising:
    selecting a unit memory cell having a memory layer to which data is written;
    providing a heating layer in thermal contact with the memory layer; and
    writing data by heating the heating layer, which heats the memory layer, until the memory layer enters into a paramagnetic state.

14. The data writing method as claimed in claim 13, wherein the heating layer is provided below the memory layer.

15. The data writing method as claimed in claim 14, wherein the memory layer is heated by a current flowing through the heating layer.

16. The data writing method as claimed in claim 13, wherein the memory layer is an amorphous rare earth (RE)-transition metal (TM) layer.

17. The data writing method as claimed in claim 14, wherein the heating layer is either a nickel and chrome alloy layer or a titanium aluminum nitride (TiAlN) layer.

18. A data writing method in a magnetic random access memory (MRAM) comprising:
   selecting a unit memory cell having a memory layer to which data is written;
   providing a heating layer in thermal contact with the memory layer;
   writing a first data to the memory layer by heating the heating layer, which heats the memory layer, until the memory layer enters into a paramagnetic state; and
   writing a second data to the memory layer by changing the magnetization state of the memory layer from a paramagnetic state to a ferromagnetic state using application of an external magnetic field.

19. The data writing method as claimed in claim 18, wherein the heating layer is provided below the memory layer.

20. The data writing method as claimed in claim 19, wherein the memory layer is heated by current flowing through the heating layer.

21. The data writing method as claimed in claim 18, wherein the memory layer is an amorphous rare earth (RE)-transition metal (TM) layer.

22. The data writing method as claimed in claim 19, wherein the heating layer is either a nickel and chrome alloy layer or a titanium aluminum nitride (TiAlN) layer.

23. The data writing method as claimed in claim 18, wherein the paramagnetic state of the memory layer is changed to the ferromagnetic state by making current flow on and parallel to the memory layer.

24. The data writing method as claimed in claim 18, wherein the external magnetic field is generated by a write current flowing through a write line provided above the memory layer.

25. A data reading method in a magnetic random access memory (MRAM) using a spontaneous Hall effect, including a metal-oxide-semiconductor (MOS) transistor having a source region, a drain region, and a gate formed on a substrate; a heating layer formed above the MOS transistor and connected to the source region of the MOS transistor, a memory layer having a data write area to which data is written, the data write area being formed on the heating layer; a bit line formed on the data write area; an upper insulating film formed on the bit line and the memory layer; and a write line formed on the upper insulating film so that a magnetic field necessary for writing data is generated in at least the data write area of the memory layer, the data reading method comprising:
   applying a read current to the memory layer; and
   measuring a spontaneous Hall voltage of the memory layer to read data from the memory layer.

26. The data reading method as claimed in claim 25, wherein measuring the spontaneous Hall voltage of the memory layer to read data from the memory layer comprises:
   determining whether the memory layer is in a paramagnetic or ferromagnetic state based on the measured spontaneous Hall voltage.

* * * * *